(12) United States Patent
Promitzer et al.

(10) Patent No.: US 8,604,761 B2
(45) Date of Patent: Dec. 10, 2013

(54) CURRENT SOURCE ARRANGEMENT, CIRCUIT ARRANGEMENT WITH THE CURRENT SOURCE ARRANGEMENT AND METHOD FOR OPERATING SUCH AN ARRANGEMENT

(75) Inventors: Gilbert Promitzer, Mureck (AT); Peter Rust, Graz (AT); Peter Boesmueller, Graz (AT)

(73) Assignee: AMS AG, Unterpremstaetten (AT)

( * ) Notice: Subject to any disclaimer, the term of this patent is extended or adjusted under 35 U.S.C. 154(b) by 94 days.

(21) Appl. No.: 13/150,958

(22) Filed: Jun. 1, 2011

(65) Prior Publication Data

US 2011/0291633 A1 Dec. 1, 2011

(30) Foreign Application Priority Data

Jun. 1, 2010 (DE) .......................... 10 2010 022 310

(51) Int. Cl.
*G05F 1/00* (2006.01)
*G05F 3/04* (2006.01)
*G05F 3/08* (2006.01)

(52) U.S. Cl.
USPC .......................................... 323/274; 323/312

(58) Field of Classification Search
USPC ......... 323/273, 374, 275, 276, 277, 278, 279, 323/280, 281, 303, 312
See application file for complete search history.

(56) References Cited

U.S. PATENT DOCUMENTS

| 4,902,970 | A * | 2/1990 | Suquet | 324/173 |
| 7,701,184 | B2 * | 4/2010 | Pan | 323/276 |
| 7,999,484 | B2 * | 8/2011 | Jurngwirth et al. | 315/247 |
| 8,155,740 | B2 * | 4/2012 | Wanasek | 607/9 |
| 2002/0181180 | A1 | 12/2002 | Ivanov et al. | |
| 2007/0159750 | A1 * | 7/2007 | Peker et al. | 361/93.1 |
| 2009/0315481 | A1 | 12/2009 | Zhao | |
| 2011/0031955 | A1 * | 2/2011 | Cheng et al. | 323/312 |
| 2011/0115770 | A1 * | 5/2011 | Seo et al. | 345/211 |

FOREIGN PATENT DOCUMENTS

| JP | 2-287492 | 11/1990 |
| JP | 2008-98495 | 4/2008 |
| KR | 10-2005-0089841 | 9/2005 |

OTHER PUBLICATIONS

U. Tietze et al., "Electronics Circuits", Handbook for Design Application, 2nd Edition, Springer Verlag, pp. 600, 601, 772-774 and 778, 1999.

* cited by examiner

*Primary Examiner* — Jessica Han
*Assistant Examiner* — Ivan Laboy Andino
(74) *Attorney, Agent, or Firm* — McDermott Will & Emery LLP

(57) ABSTRACT

In one embodiment, the current source arrangement comprises a current source (B), that has two output terminals (102, 103) and a control input (101) to be supplied with a control voltage (Vgs) and is set up to provide a current (I) as a function of a voltage (Vds) at the output terminals (102, 103) and the control voltage (Vgs), an operating point adjustment unit (E) that is supplied with an actual value (Vi) proportional to an actual value of the current (I) and is set up to provide the control voltage (Vgs) as a function of the actual value (Vi) and a predetermined target value (Iz) of the current (I), and a comparison unit (A) coupled to the control input (101) of the current source (B) for providing a monitoring signal (100), wherein the monitoring signal (100) is provided as a function of a predetermined limit voltage (VG) and the control voltage (Vgs). A method for operating a current source arrangement is also specified.

10 Claims, 3 Drawing Sheets

CURRENT SOURCE ARRANGEMENT, CIRCUIT ARRANGEMENT WITH THE CURRENT SOURCE ARRANGEMENT AND METHOD FOR OPERATING SUCH AN ARRANGEMENT

RELATED APPLICATIONS

This application claims the priority of German patent application no. 10 2010 022 310.7 filed Jun. 1, 2010, the entire content of which is hereby incorporated by reference.

FIELD OF THE INVENTION

The invention relates to a current source arrangement, a circuit arrangement with the current source arrangement and a method for operating a current source.

BACKGROUND OF THE INVENTION

Current sources based on field effect transistors, MOSFET, or bipolar transistors are used in countless applications for a very wide variety of purposes. The ability of the current source to supply a constant current under different loads, different output voltages and different supply voltages is of great importance in this regard. To achieve this, the current source must be run at the proper operating point under all conditions.

In known implementations of such MOSFET current sources or bipolar current sources, the correct operating point is determined by implementing a regulation of the provided current by monitoring the infed supply voltage, the provided voltage for an electrical load or a drain voltage or collector voltage of the current source, and assessing the operating point on that basis. In the dimensioning of the circuit, a reserve (as defined below) must be planned for in each case in order to indicate incorrect behavior and/or initiate corrective measures that prevent the current source from leaving its operating range. The reserve has the effect, however, that the current source no longer operates in the optimal current range.

SUMMARY OF THE INVENTION

One object of the invention is to provide a current source arrangement that can be operated at the correct operating point under all conditions.

In one embodiment, the current source arrangement comprises a current source, an operating point adjustment unit and a comparison unit for providing a monitoring signal. The current source comprises two output terminals and a control input for supplying a control voltage. The current source is set up to provide a current as a function of a voltage at the output terminals and as a function of the control voltage. The operating point adjustment unit is supplied with an actual value proportional to an actual value of the current. The operating point adjustment unit is set up to provide the control voltage as a function of the actual value and a predetermined target value of the current. The comparison unit is coupled to the control input of the current source. The monitoring signal is provided as a function of a predetermined limit voltage and the control voltage.

The control voltage is supplied to the current source. The current source provides the current; the voltage drops at its output terminals. The actual value, an actual voltage for instance, which is proportional to the actual value of the current is supplied to the operating point adjustment unit. Starting from the actual value and a predetermined target value of the current, the operating point adjustment unit provides the control voltage. The comparison unit acquires the control voltage and compares it to the predetermined limit voltage. If it falls below the predetermined limit voltage, then this is indicated in the form of a level change of the monitoring signal.

The current source arrangement monitors the control voltage of the current source. In case of a level change of the monitoring signal, appropriate corrective measures can be initiated by a higher-level controller, or the incorrect behavior of the current source can be indicated. This ensures that the current source is always operated at the correct operating point. Due to the monitoring of the control voltage, the current source can be operated up to the transition range from the current source operation to linear operation before the corrective measure is initiated based on the monitoring signal, or incorrect behavior is signaled. Thereby it is advantageously possible to achieve an optimal efficiency of the current source operation. Moreover, no additional reserves are necessary for determining the voltage level in the monitoring in order to take into account process and parameter fluctuations of components or functional blocks and temperature influences. The current source arrangement advantageously adapts to the variable conditions automatically.

In another embodiment, one of the output terminals is set up for connection to an electrical load.

The current is supplied to the connectable electrical load.

In a refinement, one of the output terminals is coupled to the operating point adjustment unit to detect the actual value or the actual voltage.

The operating point adjustment unit is adaptive. It provides the control voltage based on the actual value for the desired operating point of the current source.

In another embodiment, the connectable electrical load comprises at least one diode.

The at least one diode is, for example, a light-emitting diode.

In a refinement, the comparison unit is provided for adjusting a supply voltage of a supply unit.

The supply unit provides the supply voltage. The monitoring signal enables the adjustment of the level of the supply voltage with which the current source is operated.

In a refinement, the comparison unit is set up to recognize an open state of the connectable electrical load.

In this alternative embodiment, the monitoring signal indicates if a terminal of the connectable electrical load is open.

In another embodiment, the current source is configured as a field effect transistor, e.g., as an NMOS or PMOS transistor.

In another embodiment, the current source is configured as a bipolar transistor. It can be configured as an NPN type or a PNP type.

In an embodiment in which the current source comprises a p-channel MOSFET or an n-channel MOSFET and the two output terminals are consequently drain and source terminals, the control input is the gate terminal of the field effect transistor.

In one embodiment, a circuit arrangement comprises a current source arrangement as described above as well as a supply unit and an electrical load. The electrical load and the current source form elements of a series circuit. The supply unit is set up to provide a supply voltage for this series circuit. The series circuit is related to a reference potential terminal.

The supply unit provides the supply voltage for the current source or the load. The electrical load is supplied with the current generated by the current source. The control input of the current source is adjusted according to the predetermined target value of the current and the operating point situation of the current source.

Due to the fact that the control voltage of the current source is monitored directly, it is advantageously possible to implement a predictive regulation of the current source. An optimal efficiency of the current source is achieved because, in comparison to conventional methods, no reserves need to be planned for and the voltage at the output terminals of the current source can be as small as possible.

In one embodiment, a method for operating a current source arrangement has the following steps:

provision of a control voltage for a current source with two output terminals, provision of a current of the current source as a function of a voltage at the output terminals of the current source and a function of the control voltage, acquisition of an actual value proportional to the current, adjustment of the control voltage as a function of the actual value and a predetermined target value of the current, acquisition of the control voltage, and provision of a monitoring signal as a function of a predetermined limit voltage and the control voltage.

The monitoring signal indicates when the control voltage can no longer be increased and the output current of the current source threatens to drop. Consequently, a corresponding re-regulation of a supply voltage provided by a supply unit can take place as a corrective measure. This prevents the current source from entering the range of switching mode.

BRIEF DESCRIPTION OF THE DRAWINGS

Components and circuit elements that are functionally identical or have the identical effect bear identical reference signs.

DETAILED DESCRIPTION OF THE DRAWINGS

Figure 1:
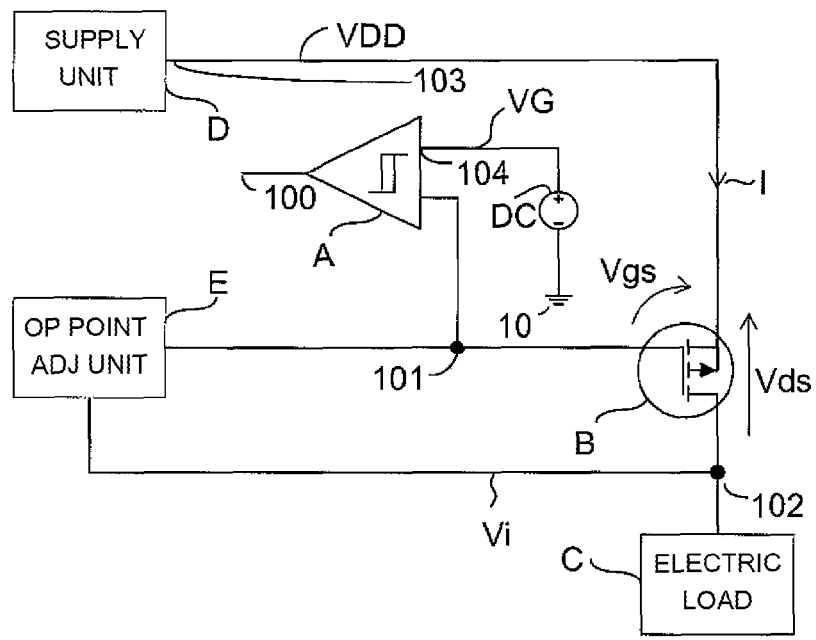
FIG. 1 shows a first exemplary embodiment of a current source arrangement in a circuit arrangement according to the invention.

FIG. 1 shows an exemplary embodiment of a current source arrangement in a circuit arrangement according to the invention. The current source arrangement comprises a current source B, an operating point adjustment unit E and a comparison unit A. The current source B comprises a control input 101, a first output terminal 102 and a second output terminal 103. The first output terminal 102 of the current source B is coupled to a terminal of the operating point adjustment unit E. Another terminal of the operating point adjustment unit E is coupled to the control input 101 of the current source B. The comparison unit A is likewise connected to the control input 101 of the current source B. The comparison unit A further comprises a terminal 104 to be supplied with a predetermined limit voltage VG. The limit voltage VG indicates the voltage difference between the maximum possible control voltage at the control input 101 and a supply voltage VDD of the current source arrangement.

The optimum value of the limit voltage VG is dependent on the implementation of the operating point adjustment unit E. A monitoring signal 100 is provided at an output of the comparison unit A. The limit voltage VG is provided by a voltage source DC which is related to a reference potential terminal 10. A voltage Vds drops between the output terminals 102 and 103 of the current source B.

The current source B is controlled by the operating point adjustment unit E via the control input 101. The control voltage Vgs results from the difference of the voltages at the second output terminal 103 and at the control input 101. The current source B supplies a defined current I. In the operating point adjustment unit E, the control input 101 of the current source B is adjusted according to the current specifications and the operating point situation of the current source B. In the operating point adjustment unit E, which can also be called an adaptive bias control, an actual value Vi, which is proportional to the current I, is acquired. The actual value Vi is an actual voltage, for example. The operating point adjustment unit E provides the control voltage Vgs as a function of this actual value Vi and the specifications for the current I. The comparison unit A compares the state of the control input 101 with the specified voltage VG at the terminal 104. The result of the comparison is indicated with a corresponding logic level of the monitoring signal 100.

The current source arrangement is operated in the circuit arrangement according to the invention. This comprises a supply unit D for providing a supply voltage VDD, and an electrical load C that is connected in series to the current source B. The current I of the current source B is supplied to the electrical load C.

The current source B is implemented in this exemplary embodiment as a p-channel field effect transistor PMOS. The control voltage Vgs is accordingly a gate-source voltage. The voltage Vds drops as a drain-source voltage between the two output terminals 103 and 102 of the current source B.

Figure 2:
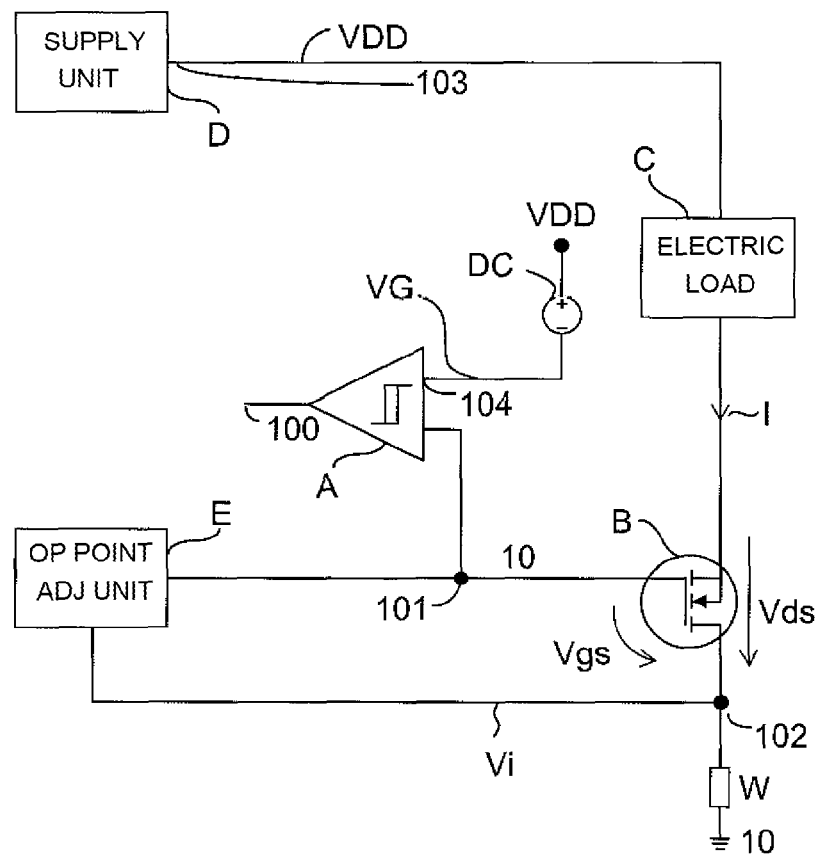
FIG. 2 shows an additional exemplary embodiment of a current source arrangement in a circuit arrangement according to the invention.

FIG. 2 shows an additional exemplary embodiment of a current source arrangement in a circuit arrangement according to the invention. This embodiment is identical to that of FIG. 1 with the difference that the current source B here is implemented as an n-channel field effect transistor NMOS, and a current-measuring resistor W is connected between the current source B and the reference potential terminal 10 in order to detect the actual current I. The electrical load C is arranged between the supply unit D and the current source B. In addition, the voltage source DC for providing the limit voltage VG is related to VDD.

This form of implementation for detecting the actual value Vi represents an alternative embodiment for detecting the actual value. For an embodiment corresponding to FIG. 1, the actual value is tapped at the drain of the current source transistor, and a current measuring resistor is not necessary.

The control of the current source arrangement according to FIG. 2 will be explained in detail in connection with the characteristic curves from FIG. 3.

Figure 3:
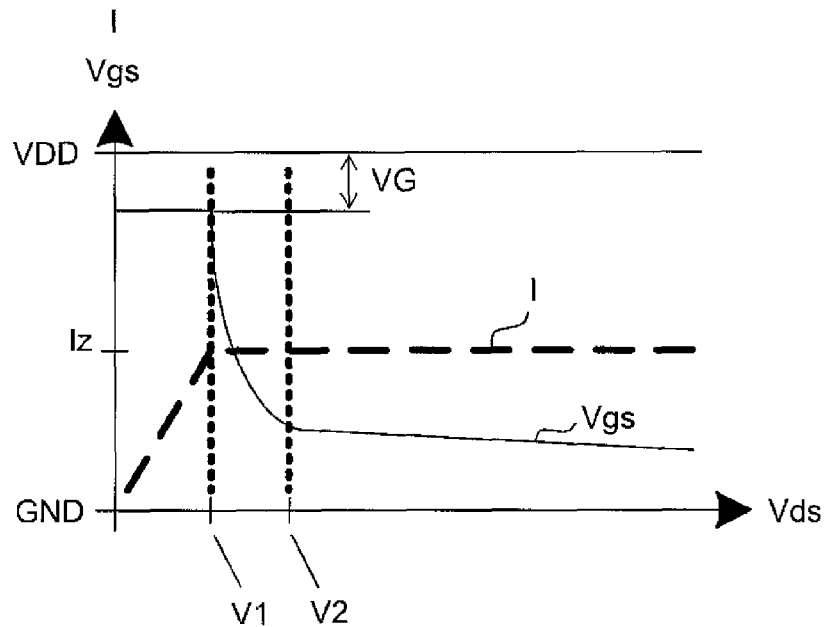
FIG. 3 shows examples of characteristic curves of a current source arrangement according to FIG. 2.

FIG. 3 shows exemplary characteristic curves of a current source arrangement according to FIG. 2. The voltage Vds between the two output terminals of the current source B is shown on the abscissa. The curve of the current I, on the one hand, and the curve of the control voltage Vgs, on the other, are shown on the ordinate. The solid line shows the curve of the control voltage Vgs relative to the voltage Vds. The broken line shows the curve of the current I relative to the voltage Vds at the two output terminals of the current source B. The value Iz designates the predetermined target value of the current I, which the current source B is to deliver constantly.

The characteristic curve of the control voltage Vgs is subdivided into three ranges. If the voltage Vds were smaller than a first voltage V1, the transistor of the current source B would be in switching mode with a dependency of the current on the voltage Vds. The range between the first voltage V1 and a second voltage V2 designates a transition range of the NMOS transistor. The range in which the voltage Vds is greater than the second voltage V2 characterizes the regular current source operation.

If the voltage Vds at the output terminals of the current source B is reduced in regular current source operation, for example by a change of the load C or a change of the supply voltage VDD of the supply unit D, the control voltage Vgs begins to rise. If the transition range between the first and the second voltage V1, V2 has been reached, the control voltage Vgs always increases more sharply until the remaining voltage difference from the magnitude of VDD reaches the limit voltage VG. From this point, the current source B would be operated in switching mode, and the current I would radically decline. The regulation of the current source arrangement is set in such a manner that the monitoring signal 100 changes shortly before the limit voltage VG is reached. This ensures that the current source B does not reach the range of switching mode operation. In contrast to known solutions, however, the transition range between first and second voltages V1, V2 can be used. In the prior art, this range of V1 to V2 was not used and constitutes what has been referred to herein as the "reserve".

A characteristic curve field corresponding to FIG. 3 for the embodiment according to FIG. 1 results by mirror inversion at the intersection point of the abscissa and ordinate into the third quadrant of the coordinate system. The voltages and currents then have negative signs.

By virtue of the fact that in the present case the control voltage Vgs is directly monitored, and since the dynamics of the control input 101 have the same dependence in regard to parameter and process fluctuations and to environmental influences as the current source B itself, the trigger point for the monitoring signal 100, i.e., the trigger point for regulating the current source, can be shifted into the transition area between the first and the second voltages V1, V2. The current source arrangement advantageously automatically adapts to processing and parameter fluctuations of components as well as to temperature influences.

Figure 4:
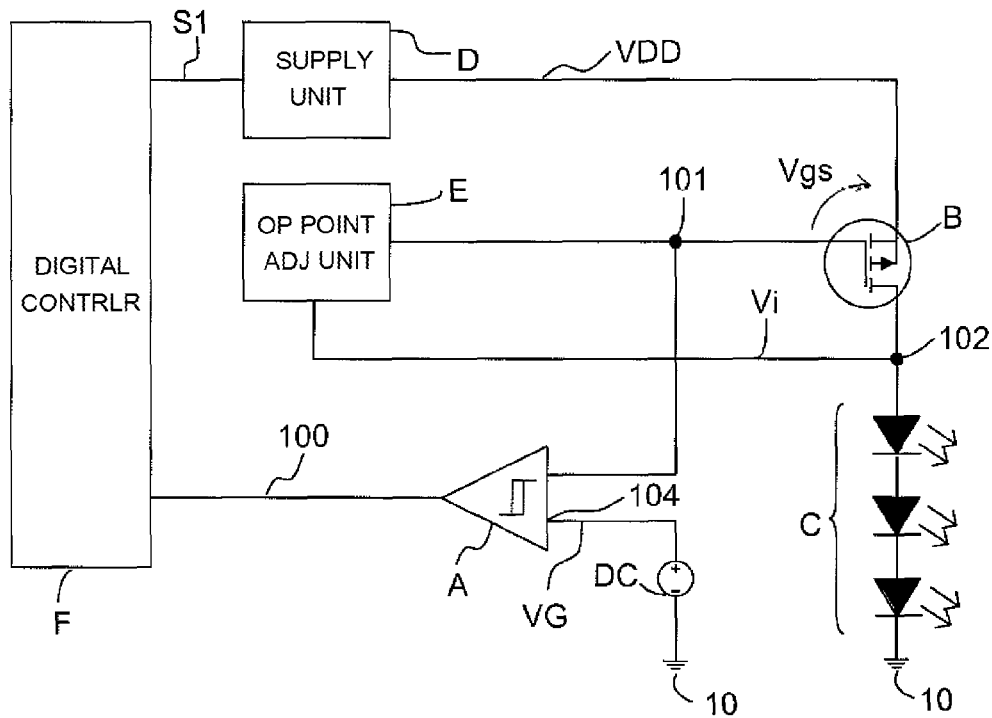
FIG. 4 shows an exemplary application of a current source arrangement according to the invention.

FIG. 4 shows an exemplary application of a current source arrangement according to the invention. The illustrated circuit is identical to that from FIG. 1, wherein the monitoring signal 100 is supplied to a digital controller F that provides a first control signal S1. The control signal S1 is supplied to the supply unit D. The digital controller F is an example of the above-mentioned higher-level controller. Digital controller F can be a digital control logic device such as an FPGA (Field Programmable Gate Array). The supply unit D is implemented, for example, as a charge pump. For the sake of example, the load C in this case has a series circuit comprising three light-emitting diodes, which are related to the reference potential terminal 10.

The monitoring signal 100 is used in this application to control the supply unit D, i.e., the charge pump, with the aid of the digital controller F and thus raise or lower the supply voltage VDD as needed. The supply voltage VDD is raised digitally and only reduced with a time delay that is implemented in the digital controller F. Such a hysteresis can alternatively be implemented in the comparison unit A. It is advantageously ensured by means of the hysteresis that the level of the supply voltage VDD is not continually raised and lowered.

Figure 5:
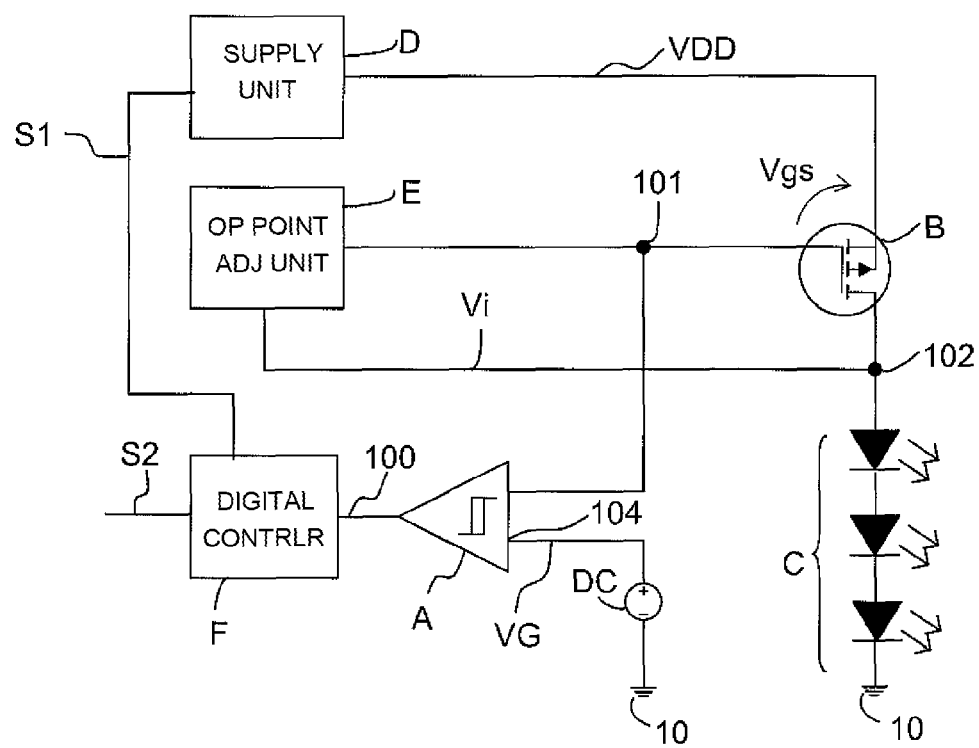
FIG. 5 shows an additional exemplary application of a current source arrangement according to the invention.

FIG. 5 shows an additional exemplary application of a current source arrangement according to the invention. The arrangement is identical to the application shown in FIG. 4, with the difference that the digital controller F in this case also produces an output signal S2. The monitoring signal 100 is evaluated here by the digital controller F, so that the signal S2 changes its level if a terminal of the electrical load C is open.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A current source arrangement comprising:
   a current source that has two output terminals and a control input configured to be supplied with a control voltage and adapted to provide a current as a function of a voltage at the output terminals and the control voltage;
   an operating point adjustment unit that is supplied with an actual value proportional to an actual value of the current and is set up to provide the control voltage as a function of the actual value and a predetermined target value of the current;
   a supply unit configured to provide a supply voltage for operating the current source; and
   a comparison unit coupled to the control input of the current source for providing a monitoring signal, and configured to adjust the supply voltage of the supply unit,
   wherein the monitoring signal is provided as a function of a predetermined limit voltage of the control voltage.

2. The current source arrangement according to claim 1, wherein one of the output terminals is set up to connect to an electrical load.

3. The current source arrangement according to claim 2, wherein one of the output terminals is coupled to the operating point adjustment unit for detecting the actual value.

4. The current source arrangement according to claim 2, wherein the electrical load comprises at least one diode.

5. The current source arrangement according to claim 1, wherein the comparison unit is set up to recognize an open state of the connectable electrical load.

6. The current source arrangement according to claim 1, wherein the current source is implemented as a field-effect transistor.

7. The current source arrangement according to claim 1, wherein the current source is implemented as a bipolar transistor.

8. A circuit arrangement with a current source arrangement according to claim 1, comprising:
   an electrical load that is connected in series to the current source, wherein the series circuit is supplied by the supply unit and is related to a reference potential terminal, and wherein the supply unit is coupled to one of the output terminals of the current source.

9. A method for operating a current source arrangement comprising:
   providing a control voltage for a current source with two output terminals;
   providing a current of the current source as a function of a voltage at the output terminals of the current source and as a function of the control voltage;
   acquiring an actual value proportional to the current;
   adjusting the control voltage as a function of the actual value and a predetermined target value of the current;
   acquiring the control voltage;

providing a monitoring signal as a function of a predetermined limit voltage and the control voltage; and adjusting a supply voltage for operating the current source based on the monitoring signal.

10. The current source arrangement according to claim 1, wherein the current source is operated in a linear range.

* * * * *